US 8,247,840 B2

(12) United States Patent
Kapoor et al.

(10) Patent No.: US 8,247,840 B2
(45) Date of Patent: *Aug. 21, 2012

(54) APPARATUS AND METHOD FOR IMPROVED LEAKAGE CURRENT OF SILICON ON INSULATOR TRANSISTORS USING A FORWARD BIASED DIODE

(75) Inventors: Ashok Kumar Kapoor, Palo Alto, CA (US); Robert Strain, San Jose, CA (US)

(73) Assignee: Semi Solutions, LLC, Los Gatos, CA (US)

(*) Notice: Subject to any disclaimer, the term of this patent is extended or adjusted under 35 U.S.C. 154(b) by 330 days.

This patent is subject to a terminal disclaimer.

(21) Appl. No.: 12/348,797

(22) Filed: Jan. 5, 2009

(65) Prior Publication Data

US 2009/0174464 A1 Jul. 9, 2009

Related U.S. Application Data

(63) Continuation-in-part of application No. 11/737,559, filed on Apr. 19, 2007, now Pat. No. 7,586,155, which is a continuation of application No. 11/029,542, filed on Jan. 4, 2005, now Pat. No. 7,224,205.

(60) Provisional application No. 60/585,582, filed on Jul. 7, 2004, provisional application No. 60/601,979, filed on Aug. 17, 2004, provisional application No. 61/006,307, filed on Jan. 4, 2008.

(51) Int. Cl.
*H01L 29/66* (2006.01)
(52) U.S. Cl. ............ 257/145; 257/149; 365/295
(58) Field of Classification Search .......... 365/145, 365/149; 257/295, 300
See application file for complete search history.

(56) References Cited

U.S. PATENT DOCUMENTS

| 3,921,035 A | 11/1975 | Holmes |
| 4,412,308 A | 10/1983 | Bereron |
| 4,418,468 A | 12/1983 | Vora et al. |
| 4,616,404 A | 10/1986 | Wang et al. |
| 4,679,170 A | 7/1987 | Bourassa et al. |
| 5,168,337 A | 12/1992 | Muto et al. |

(Continued)

FOREIGN PATENT DOCUMENTS

TW        419854        1/2001

(Continued)

OTHER PUBLICATIONS

Vora, M., et al., "A 2 Micron High Performance Bipolar 64K ECL Static RAM Technology With 200 Square Microns Contactless Memory Cell," 1984, IEDM Technical Digest 1984; pp. 690-693.

(Continued)

*Primary Examiner* — Howard Weiss
*Assistant Examiner* — Steven Rao
(74) *Attorney, Agent, or Firm* — Michael A. Glenn; Glenn Patent Group

(57) ABSTRACT

Use of a forward biased diode to reduce leakage current of transistors implemented on silicon on insulator (SOI) is a particular challenge due to the difficulty of achieving effective contact with the region beneath the gate of the transistor. An improved implementation in SOI gate fingers that reach under the source through tunnels that are contacted with a region outside the transistor. A further embodiment uses drain extension implants to provide good channel connection.

18 Claims, 2 Drawing Sheets

U.S. PATENT DOCUMENTS

| | | | |
|---|---|---|---|
| 5,266,831 A | 11/1993 | Phipps et al. | |
| 5,365,102 A | 11/1994 | Mehrotra et al. | |
| 5,416,443 A | 5/1995 | Cranford et al. | |
| 5,440,243 A | 8/1995 | Lyon | |
| 5,559,451 A | 9/1996 | Okamura | |
| 5,701,093 A | 12/1997 | Suzuki | |
| 5,717,237 A | 2/1998 | Chi | |
| 5,753,955 A | 5/1998 | Fechner | |
| 5,760,449 A | 6/1998 | Welch | |
| 5,763,960 A | 6/1998 | Ceccherelli et al. | |
| 5,804,470 A | 9/1998 | Wollesen | |
| 5,821,769 A * | 10/1998 | Douseki | 326/34 |
| 5,831,451 A | 11/1998 | Bosshart | |
| 5,856,708 A | 1/1999 | Wollesen | |
| 5,886,381 A | 3/1999 | Frisina | |
| 5,969,564 A | 10/1999 | Komatsu et al. | |
| 5,985,722 A | 11/1999 | Kishi | |
| 6,018,168 A | 1/2000 | Yang | |
| 6,034,563 A | 3/2000 | Mashiko | |
| 6,081,107 A | 6/2000 | Marino | |
| 6,118,328 A | 9/2000 | Morikawa | |
| 6,177,703 B1 | 1/2001 | Cunningham | |
| 6,194,276 B1 | 2/2001 | Chan et al. | |
| 6,198,173 B1 | 3/2001 | Huang | |
| 6,198,652 B1 * | 3/2001 | Kawakubo et al. | 365/145 |
| 6,204,105 B1 | 3/2001 | Jung | |
| 6,204,696 B1 | 3/2001 | Krishnamurthy et al. | |
| 6,225,827 B1 | 5/2001 | Fujii et al. | |
| 6,232,163 B1 | 5/2001 | Voldmann et al. | |
| 6,294,816 B1 | 9/2001 | Baukus et al. | |
| 6,359,477 B1 | 3/2002 | Pathak | |
| 6,384,639 B1 | 5/2002 | Chen et al. | |
| 6,392,860 B1 | 5/2002 | Lin et al. | |
| 6,411,560 B1 | 6/2002 | Tanizaki et al. | |
| 6,429,482 B1 | 8/2002 | Culp et al. | |
| 6,441,647 B2 | 8/2002 | Jeon | |
| 6,465,849 B1 | 10/2002 | Chang et al. | |
| 6,521,948 B2 | 2/2003 | Ebina | |
| 6,573,549 B1 | 6/2003 | Deng et al. | |
| 6,593,799 B2 | 7/2003 | De et al. | |
| 6,600,187 B2 | 7/2003 | Kim | |
| 6,621,292 B2 | 9/2003 | Sakata et al. | |
| 6,628,551 B2 | 9/2003 | Jain | |
| 6,643,199 B1 | 11/2003 | Tang et al. | |
| 6,645,820 B1 | 11/2003 | Peng et al. | |
| 6,674,123 B2 | 1/2004 | Kim | |
| 6,690,039 B1 | 2/2004 | Nemati et al. | |
| 6,693,333 B1 | 2/2004 | Yu | |
| 6,707,708 B1 | 3/2004 | Alvandpour et al. | |
| 6,711,063 B1 | 3/2004 | Dejenfelt et al. | |
| 6,711,088 B2 | 3/2004 | Hayashi et al. | |
| 6,787,850 B1 | 9/2004 | Pelloie | |
| 6,891,389 B1 | 5/2005 | Walker et al. | |
| 6,894,324 B2 | 5/2005 | Ker et al. | |
| 6,898,116 B2 | 5/2005 | Peng | |
| 6,933,573 B2 | 8/2005 | Ker et al. | |
| 6,933,744 B2 | 8/2005 | Das et al. | |
| 6,940,317 B2 | 9/2005 | Suga | |
| 6,958,519 B2 | 10/2005 | Gonzalez et al. | |
| 6,969,888 B2 | 11/2005 | Williams et al. | |
| 6,985,026 B2 | 1/2006 | Toyoyama | |
| 7,064,942 B2 | 6/2006 | Ker et al. | |
| 7,102,914 B2 | 9/2006 | Chen et al. | |
| 7,132,711 B2 | 11/2006 | Forbes et al. | |
| 7,209,332 B2 | 4/2007 | Stockinger et al. | |
| 7,253,485 B2 | 8/2007 | Shibahara | |
| 7,453,308 B2 | 11/2008 | Tihanyi | |
| 7,586,155 B2 | 9/2009 | Kapoor | |
| 2001/0054886 A1 | 12/2001 | Takahashi et al. | |
| 2002/0031028 A1 | 3/2002 | Forbes et al. | |
| 2002/0096723 A1 | 7/2002 | Awaka | |
| 2002/0100920 A1 | 8/2002 | Yamauchi | |
| 2002/0153957 A1 | 10/2002 | Jordanov | |
| 2002/0154462 A1 | 10/2002 | Ker et al. | |
| 2002/0185681 A1 | 12/2002 | Nakano et al. | |
| 2002/0191436 A1 | 12/2002 | Kobayashi et al. | |
| 2002/0195623 A1 | 12/2002 | Horiuchi | |
| 2003/0089951 A1 | 5/2003 | Ker et al. | |
| 2003/0178648 A1 | 9/2003 | Bansal | |
| 2004/0004298 A1 | 1/2004 | Madurawe | |
| 2004/0022109 A1 | 2/2004 | Yoon et al. | |
| 2004/0077151 A1 | 4/2004 | Bhattacharyya | |
| 2004/0252546 A1 | 12/2004 | Liaw | |
| 2005/0035410 A1 | 2/2005 | Yeo et al. | |
| 2007/0114582 A1 | 5/2007 | Shiu et al. | |
| 2008/0048266 A1 | 2/2008 | Russ et al. | |
| 2008/0230851 A1 | 9/2008 | Fukui | |

FOREIGN PATENT DOCUMENTS

| | | |
|---|---|---|
| TW | 479852 | 3/2002 |
| TW | 480773 | 3/2002 |
| TW | 495106 | 7/2002 |

OTHER PUBLICATIONS

Takamiya, M., et al., "High Performance Electrically Induced Body Dynamic Threshold SOI MOSFET (EIB-DTMOS) with Large Body Effect and Low Threshold Voltage," 1998, IEDM Technical Digest.

Diaz, C.H., et al., "Device Properties in 90nm and beyond and implications on Circuit Design," 2003, IEEE.

Rabaey, J., "Issues in Low Power Design—Managing Leakage," Aug. 23, 2004, Dept. of Electrical Engineering and Computer Sciences, University of California at Berkeley.

Bohr, M., "High Performance Logic Technology and Reliability Challenges," Apr. 1, 2003, IPRS, Intel.

Fallah, et al., "Standby and Active Leakage Current Control and Minimization in CMOS VLSI Circuits," Apr. 2004, IEICE Trans. On Electronics, Special Section on Low-Power LSO and Low Power IP. vol. E88-c, No. 4.

Cao, et al., "Reducing Dynamic Power and Leakage Power for Embedded Systems," Sep. 2002, ASIC-SOC Conference, 15th Annual IEEE International, vol. Uss.

Min. et al., "Zigzag Super Cut-Off CMOS (ZSCCMOS) Block Activation with Self-Adaptive Voltage Level Controller: An alternative to Clock-Gating Scheme in Leakage Dominant Era," 2003 International Solid-State Circuits Conference, Digest of Technical Papers ISSCC, IEEE International.

Henzler, et al., "Fast Power-Efficient Circuit-Block Switch-Off Scheme," Jan. 22, 2004, Electronics Letters, vol. 40. No. 2.

Narendra, et al., "Full Chip Subthreshold Leakage Power Prediction and Reduction Techniques for sub-0.18um CMOS," Mar. 2004, IEEE Journal of Solid State Circuits, vol. 39, No. 2, pp. 501-510.

Kao, et al., "Dual-Threshold Voltage Techniques for Low-Power Digital Circuits," Jul. 2000, IEEE Journal of Solid-State Circuits, vol. 35, No. 7.

Kuroda, et al., "A 0.9-V, 150MHz, 10-mW, 4mm2, 2-D Discrete Cosine Transform Core Processor with Variable Threshold-Voltage (VT) Scheme," Nov. 1996, IEEE Journal of Solid-State Circuits, vol. 31, No. 11.

Tschanz, et al., "Adaptive Body Bias for Reducing Impacts of Die-to-Die and within-die Parameter Variations on Microprocessor Frequency and Leakage, Solid State Circuits Conference," Feb. 2002, Digest of Technical Papers, ISSCC, 2002 IEEE International, vol. 1.

von Arnim, et al., "Efficiency of Body Biasing in 90-nm CMOS for Low-Power Digital Circuits," Jul. 2005, IEEE Journal of Solid State Circuits, vol. 40, No. 7, pp. 1549-1556.

Borkar, S., "Circuit Techniques for Subthreshold Leakage Avoidance, Control, and Tolerance," 2004, IEEE.

Sze, S.M.; "Physics of Semiconductor Devices"; 1981, John Wiley & Sons, Second Edition, pp. 77, 78, 362-371.

\* cited by examiner

FIGURE 3a
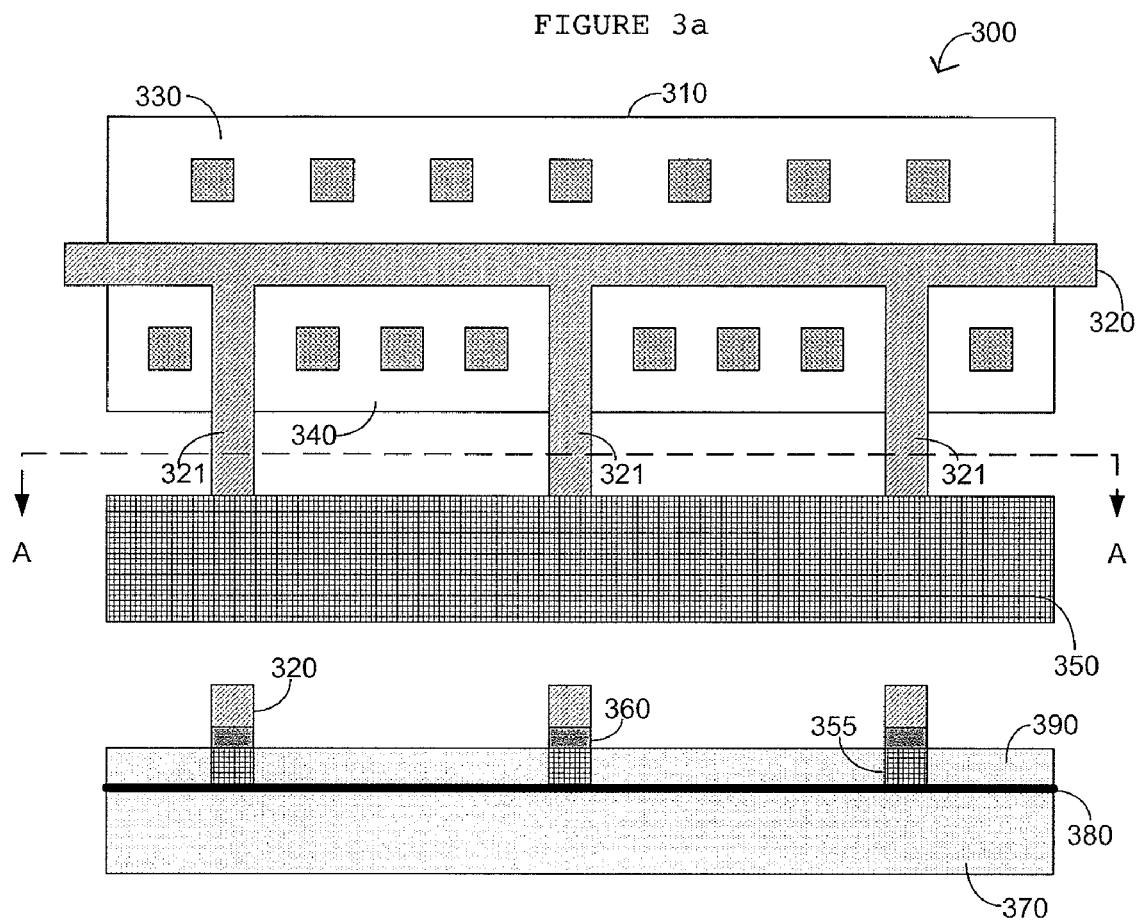
FIGURE 3b
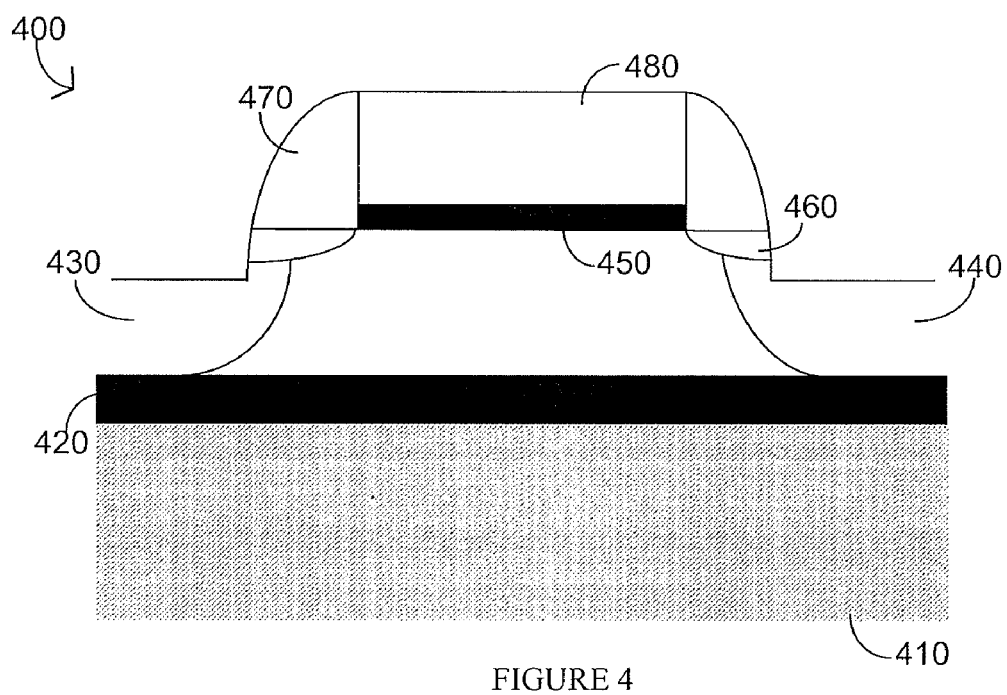
FIGURE 4

APPARATUS AND METHOD FOR IMPROVED LEAKAGE CURRENT OF SILICON ON INSULATOR TRANSISTORS USING A FORWARD BIASED DIODE

CROSS REFERENCE TO RELATED APPLICATIONS

This application claims priority from U.S. provisional patent application Ser. No. 61/006,307 filed Jan. 4, 2008 and is a continuation-in-part of U.S. patent application Ser. No. 11/737,559, filed Apr. 19, 2007 now U.S. Pat. No. 7,586,155, which is a continuation of U.S. patent application Ser. No. 11/029,542 now U.S. Pat. No. 7,224,205, filed Jan. 4, 2005 which claims priority from U.S. provisional application Ser. Nos. 60/585,582, filed Jul. 7, 2004, and 60/601,979, filed Aug. 17, 2004, each of which is incorporated herein in its entirety by this reference thereto.

BACKGROUND OF THE INVENTION

The invention relates to MOS transistors implemented on SOI. More particularly, the invention relates to the improvement of drive-strength and leakage of deep submicron MOS transistors on SOI.

DESCRIPTION OF THE PRIOR ART

The use of metal oxide semiconductor (MOS) transistors implemented on silicon-on-insulator (SOI) is well known in the art. The SOI technology, while having various complexities, provides certain advantages over bulk MOS transistors. While transistors implemented on SOI tend to have a lower current leakage than bulk MOS transistors there is still a need in the art to reduce such currents further, especially in the deep submicron, i.e., under 100, nanometers technologies.

The prior art suggests various approaches to connecting a device between the gate and the substrate of the MOS, transistor primarily to control threshold voltages. One such approach is described in detail in a U.S. Pat. No. 7,224,205 (the '205 patent), entitled Apparatus and Method for Improving Drive-Strength and Leakage of Deep Submicron MOS Transistors, assigned to common assignee, and which is incorporated herein in its entirety by this reference thereto. The connection of a forward biased diode between the gate and the well of a MOS transistor is shown in the '205 patent. Such approach enables the change of threshold voltage of the MOS transistor as a function of the input voltage, and thereby provides the benefits described therein in more detail.

Implementing such a solution for MOS transistors that are implemented on SOI requires certain considerations due to the limitations of SOI and, more specifically, due to partially depleted SOI, because there is a problem in making an effective contact with the region beneath the gate. While Pelloie in U.S. Pat. No. 6,787,850 suggests a dynamic threshold voltage MOS transistor that is fitted with a current limiter, Pelloie does overcome the stated limitation.

It would be therefore advantageous to provide an approach that improved drive strength and leakage of deep submicron MOS transistors that are implemented in SOI.

BRIEF DESCRIPTION OF THE DRAWINGS

FIG. 3a is a plan view and FIG. 3b is a section view of a MOS transistor comprising a well contact area, and cross section thereof, in accordance with an embodiment of the invention; and FIG. 4 is a cross section view of a MOS transistor formed over a SOI wafer in accordance with an embodiment of the invention.

DETAILED DESCRIPTION OF THE INVENTION

The use of a forward biased diode to reduce leakage current in metal-oxide semiconductor (MOS) transistors implemented on silicon on insulator (SOI) is a particular challenge because it is difficult to achieve effective contact with the region beneath the gate of the transistor. This is particularly true for a MOS transistor that is fabricated on partially depleted SOI. An improved implementation in SOI that includes the use of gate fingers that reach under the source through tunnels that are contacted with a region outside the transistor is disclosed. A further embodiment uses drain extension implants to provide a good channel connection.

Figure 1:
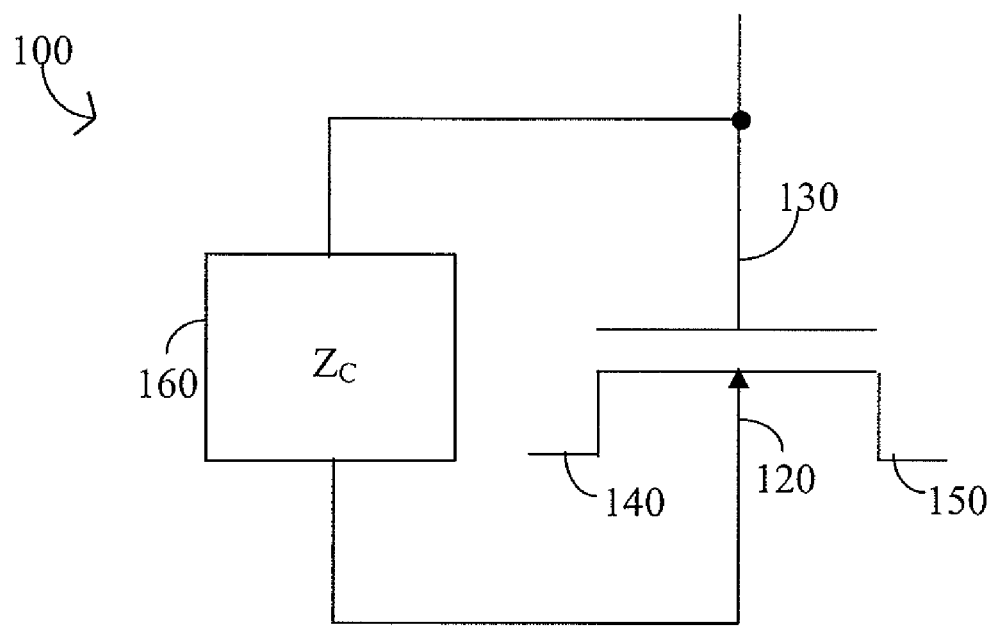
FIG. 1 is a schematic diagram showing a control circuit $Z_c$ connected between the gate and substrate terminals of a NMOS transistor (prior art)

FIG. 1 shows a prior art circuit 100 that is discussed in detail in U.S. Pat. No. 7,224,205, assigned to common assignee, and which is incorporated herein in its entirety by this reference thereto. In an N-type metal-oxide semiconductor (NMOS) transistor comprising a substrate 120, a gate 130, a drain 140, and a source 150, a control circuit $Z_c$ 160 connected between the gate 130 and this substrate 120. This control circuit $Z_c$ implements a dynamic voltage control by using, for example, various types of diodes to control substrate voltage. By providing for threshold voltages in the ON and OFF states of the controlled NMOS transistor, an improvement in drive current in the ON state and leakage current in the OFF state is achieved. Furthermore, an extremely area efficient implementation of dynamic threshold voltage control is provided as described in further detail below.

Figure 2:
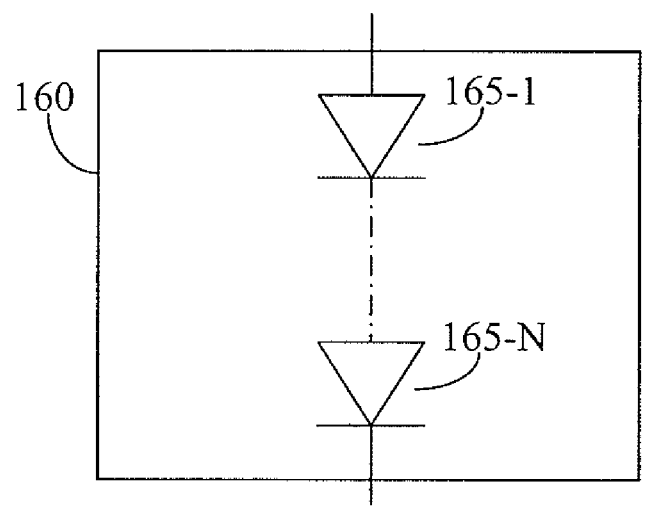
FIG. 2 is a schematic diagram showing the control circuit $Z_c$ (prior art)

FIG. 2 shows details of control circuit 160 that is comprised of one or more diodes 165 connected in series. The threshold voltage is dynamically adjusted by varying the diode layout geometry. No significant variations in the manufacturing process are required. The diodes are fabricated using a variety of techniques. One such technique uses diffused diodes. These diodes are conventional diodes that are fabricated by diffusing n-type and p-type layers in a completely isolated structure. The voltage across the diodes is controlled by adjusting the doping profiles in silicon and programming the area, thereby controlling the voltage drop across the diode. In one embodiment, a capacitor (not shown) is connected in parallel with the diodes 165. Such embodiment is disclosed in U.S. patent application Ser. No. 11/533,332, entitled Apparatus and Method for Improving Drive-Strength and Leakage of Deep Submicron MOS Transistors, assigned to common assignee, and incorporated herein in its entirety by this reference thereto.

While the solutions discussed above are applicable to both bulk MOS and SOI MOS, application of the invention SOI requires specific consideration due to its unique structure. A cross section of an SOI wafer is shown in FIG. 3, in which the bare wafer is formed of two or three layers, including a thin active silicon layer 390 and a thick foundation 370. The thick foundation 370 may be made of materials such as silicon, sapphire, or glass. An insulating layer 380 is provided between the foundation 370 and the active silicon layer 370, if the foundation layer 370 is a non-insulating material, such as silicon. The manufacturing process for such wafers is outside the scope of this disclosure and therefore not discussed herein. A person skilled in the art will note, however, that the thin silicon layer 380 provides for a limited depth of source and drain junctions of a MOS transistor that is diffused into this area. Due to the limited thickness of the silicon layer 390, the resistivity of the semiconductor region under the gate is increased. As a result, when applying the control circuit 160, where the contact to silicon under the gate is made from the edges along the length of the transistor, a large series resistance is encountered. The effectiveness of this method is reduced when used with a large series resistance which results from larger than minimum sized transistors. The major challenge for applying an adaptive threshold voltage to the MOS transistor is contacting to the region beneath the gate with minimal parasitic resistance. Pelloie resolved this problem by abutting a device to one side of the transistor. However, this is not an effective solution for transistors of large width W because of voltage variations from the contact region across the transistor.

Therefore, a different approach is taught herein with respect to FIG. 3. A MOS transistor 310 is formed in an SOI wafer having a drain region 330 which is N+ for a NMOS transistor, a source region 340 which is N+ for a NMOS transistor, and a gate 320, typically made of poly silicon and placed over the area 310 that comprises the transistor. The MOS transistor further comprises one or more gate fingers 321 that extend from the gate 320. The gate fingers 321 protect the silicon film from the source/drain implants. This approach creates tunnels of the P– silicon 355, surrounded by the N+ source region, that can be contacted with a P+ silicon, thereby creating a well contact region 350 that is located outside of the transistor 310. The region created by the P+ substrate 350 is the well contact that may be used to contact the control circuit 160, or specifically a diode 165, for example a poly diode, to make the required connection to the well. This approach ensures an effective connection of the diode 165 to the well of the NMOS transistor to make effective use of its capability to improve drive strength or leakage current when the NMOS transistor is implemented on an SOI wafer. In one embodiment of the invention, the poly gate over the connecting fingers 321 acts as a feed-forward capacitor. Further, a poly diode 165 may be created in the single crystal silicon, contiguous with the well contact region 350. It should be noted that the dimensions of the device depicted in FIG. 3 are provided for illustration only and should not be considered as design rules. Rather, the principle of creating the gate fingers for the purpose of creating an effective well contact for a MOS transistor fabricated in SOI is shown. A person skilled in the art would appreciate that the implementation is equally applicable for PMOS transistors with the appropriate adjustments to account for the different polarity.

As noted above, the region 390 of an SOI wafer is relatively thin, resulting in a relatively shallow active substrate for the MOS transistor implemented on such wafers. One problem with this is that the SOI side thin films may have a rather small conductance, which may prove ineffective in changing the leakage characteristics of the MOS transistor 310. This problem can be alleviated by targeting a thicker substrate film. If this film is so thick that it becomes impossible to bottom out the source and drain regions on the underlying insulator reliably, then that problem can be solved by thinning the source and drain silicon by processes, such as etching, after spacer formation, but the N+ and P+ implants.

Reference is now made to a cross-section of an MOS transistor implemented on an SOI wafer, as shown in FIG. 4. The SOI wafer consists of a foundation layer 410 and an $SiO_2$ insulating layer 420. The active silicon over the insulating layer 420 is used for the creation of the MOS transistor. Areas 430 and 440 form the source and drain of the MOS transistor. Layer 450 is an $SiO_2$ layer that insulates the channel 490 of the MOS transistor from the gate electrode 480, which is made of polysilicon and placed over insulating layer 450. Areas 470 are spacers made, for example, from $Si_3N_4$, and area 460 is used for the lightly doped drain (LDD) structure. Therefore, a gate electrode 480 is formed over insulator 450. $SiN_4$ is deposited in the regions 470 to create spacers. After a nitride etch, the silicon over the regions where the source and drain areas 430 and 440 are to be placed is further etched. This step is performed when the gate 480 is covered by a thin oxide. The etch is performed until such level where it is possible to bottom out the source and drain regions 430 and 440, as shown in FIG. 4, i.e. that the source and drain implants can reach through the active silicon layer all the way to the insulating layer 420. Once done, an implant takes place to form the desired source, drain, and gate areas, that is N+ or P+ as the case may be.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. An apparatus, comprising:
a well area having a first doping type of a metal-oxide-silicon (MOS) transistor formed on a silicon-on-insulator (SOI);
a polysilicon gate of said MOS transistor positioned over said well area for separating a source region and a drain region, both of a second doping type, of said MOS transistor;
a gate oxide separating all portions of said well area from overlying polysilicon regions;
a doped region of said first doping type for enabling contact to said well area;
at least one finger of thin film silicon extending from said gate area of said MOS transistor to abut with said doped region, said at least one finger protecting an underlying well region from said second doping type source and/or drain, such that an extension of said at least one finger enables said well area retain a doping character of said first doping type and form a connectivity tunnel through said source of said second doping type or said drain of said second doping type to said doped region of said first doping type; and
at least one forward biased junction diode coupled between said gate and said well through said doped region and conducting path.

2. The apparatus of claim 1, wherein said at least one finger of thin film silicon extends perpendicularly to said polysilicon regions of the gate.

3. The apparatus of claim 1, wherein said forward biased junction diode is formed from polycrystalline silicon.

4. The apparatus of claim 1, wherein said forward biased junction diode is formed as a single crystal silicon from said doped region.

5. The apparatus of claim 1, further comprising: a feed forward capacitor connected between said gate and said well area through said doped region.

6. The apparatus of claim 1, wherein said well contacting doped region comprises a P+ region for an N-type MOS transistor.

7. The apparatus of claim 1, wherein said well contacting doped region comprises an N+ region for a P-type MOS transistor.

8. A method of manufacturing a semiconductor device, comprising the steps of:
   forming a well area having a first doping type for a metal-oxide-silicon (MOS) transistor on a silicon-on-insulator (SOI);
   forming a polysilicon gate of said MOS transistor over said well area to separate a source region and a drain region, both of a second doping type, of the MOS device;
   forming a gate oxide to separate all portions of said well area from overlying polysilicon regions;
   forming a doped region of said first doping type to enable contact to said well area;
   forming at least one finger of thin film silicon that extends from said well area of said MOS transistor to abut with said doped region
   protecting well area beneath said at least one finger from source/drain doping of a second doping type; and,
   forming in an isolated structure at least one junction diode coupled between said gate and said well are through said doped area such that said junction diode is forward biased;
   wherein said at least one finger that extends from said well area retains a doping character of said first doping to form a connectivity tunnel through an oppositely doped source region or oppositely doped drain region to said doped region.

9. The method of claim 8, wherein the step of forming at least one finger of thin film silicon comprising said at least one finger of thin film extending perpendicularly to said polysilicon regions of said gate.

10. The method of claim 8, further comprising the step of: forming said forward biased junction diode from polycrystalline silicon.

11. The method of claim 8, further comprising the step of: forming said forward biased diode as a single crystal silicon from said doped region.

12. The method of claim 8, further comprising the step of: forming a feed forward capacitor connected between said gate and said well area through said doped region.

13. The method of claim 8, further comprising the step of: forming said doped region by creating a P+ region for an N-type MOS transistor.

14. The method of claim 8, further comprising the step of: forming said doped region by creating a N+ region for a P-type MOS transistor.

15. A method of manufacturing a semiconductor device, comprising the step of: forming a polysilicon gate over a thin layer of insulator created over an active area of a silicon-on-insulator (SOI) wafer; depositing nitride for a spacer; performing a nitride etch; performing a silicon etch to a level that bottoms out a drain and a source region of a MOS transistor formed over said SOI; implanting a drain, source and gate of said MOS transistor; wherein said MOS transistor is formed on said SOI having a thick active layer over an insulator of said SOI; and forming in an isolated structure at least a forward biased junction diode connected between said gate and said well area through said doped region.

16. The method of claim 15, further comprising the step of: forming said forward biased junction diode from polycrystalline silicon.

17. The method of claim 15, further comprising the step of: forming said forward biased diode as a single crystal silicon from said doped region.

18. The apparatus of claim 5, in which said feed forward capacitor is formed by said polysilicon finger, said gate oxide and said conductive region of said first doping type.

* * * * *